(12) United States Patent
Sohda et al.

(10) Patent No.: US 7,049,607 B2
(45) Date of Patent: May 23, 2006

(54) ELECTRON BEAM WRITING EQUIPMENT AND ELECTRON BEAM WRITING METHOD

(75) Inventors: Yasunari Sohda, Kawasaki (JP); Hiroya Ohta, Kodaira (JP); Osamu Kamimura, Kokubunji (JP); Susumu Gotoh, Tokyo (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/951,769

(22) Filed: Sep. 29, 2004

(65) Prior Publication Data

US 2005/0040343 A1    Feb. 24, 2005

Related U.S. Application Data

(63) Continuation of application No. 10/629,567, filed on Jul. 30, 2003, now Pat. No. 6,809,319.

(30) Foreign Application Priority Data

Jan. 6, 2003    (JP)    ............................. 2003-000187

(51) Int. Cl.
    *G01N 23/00*    (2006.01)
(52) U.S. Cl. .............................. 250/492.21; 250/492.1; 250/310
(58) Field of Classification Search ............ 250/492.21
    See application file for complete search history.

(56) References Cited

U.S. PATENT DOCUMENTS

| 5,578,821 | A |   | 11/1996 | Meisberger et al. |
| 5,834,783 | A | * | 11/1998 | Muraki et al. .............. 250/398 |
| 6,566,885 | B1 |   | 5/2003 | Pinto et al. |
| 2002/0148961 | A1 |   | 10/2002 | Nakasuji et al. |

OTHER PUBLICATIONS

Journal of Vacuum and Technology, B12, 1992, Sakitani et al, pp. 2759-2763.
Journal of Vacuum and Technology, B5, 1987, Iwadate et al, pp. 75-78.

* cited by examiner

*Primary Examiner*—Nikita Wells
*Assistant Examiner*—Phillip A. Johnston
(74) *Attorney, Agent, or Firm*—Mattingly,Stanger,Malur & Brundidge, P.C.

(57) ABSTRACT

Electron beam writing equipment has an electron source and an electron optics system for scanning an electron beam emitted from the electron source on a sample via deflection means having at least two different deflection speeds. An objective lens is used to form a desired pattern on the sample The electron beam is moved by high speed scanning with the deflection means to repeat formation of a patterned beam. The electron beam is moved on the mark for beam correction by low speed scanning with the deflection means in synchronization with one cycle of the repetition. The position or the deflection distance of the electron beam or blanking time is corrected using detectors for back scattered or secondary electrons.

15 Claims, 7 Drawing Sheets

ELECTRON BEAM WRITING EQUIPMENT AND ELECTRON BEAM WRITING METHOD

This is a continuation application of U.S. Ser. No. 10/629,567, filed on Jul. 30, 2003, now U.S. Pat. No. 6,809,319.

BACKGROUND OF THE INVENTION

The present invention relates to an electron beam writing technique for use in a manufacturing process of a semiconductor integrated circuit. More specifically, the present invention relates to high-precision electron beam writing equipment and writing method.

In prior art electron beam writing equipment, the size of the fastest deflection field on a sample is about 50 µm square (for example, Sakitani et al.: Journal of Vacuum and Technology, B12, 1992, pp. 2759–2763).

To deflect the 50 µm square precisely, deflection is corrected. Specifically, an electron beam is deflected to near the corner of the deflection field to detect a mark for beam correction near it, thereby measuring and correcting a difference between a desired deflection distance and an actually measured deflection distance.

Electron beam writing equipment having a micro deflection field of about 2 µm square is proposed (for example, see Iwadate et al.: Journal of Vacuum and Technology, B5, 1987, pp. 75–78).

As a reliable method for making electron beam writing equipment faster, there is a multi beam method. In this method, plural electron beams arrayed at a predetermined pitch in a two-dimensional manner are used. The distance between the electron beams is short so that the fastest deflection field is about 2 µm square.

In the above prior art deflection correction method of 50 µm square, scanning above 2 µm is performed for mark detection itself. The prior art method cannot be applied to a 2 µm-square field. In the above prior art, a deflection correction method of such micro deflection field is not described.

SUMMARY OF THE INVENTION

An object of the present invention is to provide an electron beam writing technique which can correct deflection for a micro field in electron beam writing equipment with high precision.

To achieve the above object, the present invention has a function deflecting an electron beam at at least two different deflection speeds for scanning on a sample; a function repeating formation of a patterned beam in the electron beam by high speed scanning; a function moving the electron beam on a mark for beam correction by low speed scanning in synchronization with its one process; and a function detecting a backscattered electron or a secondary electron from the scanned mark for beam correction and near it or a transmission electron therethrough to correct the position or the deflection distance of the electron beam or blanking time from the detected result.

The method according to the present invention is particularly suitable for multi-beam electron beam writing equipment. Correction using plural electron beams is effective. For example, the electron beam writing equipment has a function moving adjacent electron beams in parallel to form a patterned beam; and a function comparing the detected results of the plural electron beams.

In addition, the patterned beam is separately provided plural areas to perform higher-precision measurement. Further, as solving means, low speed scanning is performed in plural directions to change an on/off pattern of an electron beam at high speed scanning by the scanning direction.

Representative construction examples of the present invention will be listed.

(1) Electron beam writing equipment of the present invention has: an electron source; an electron optics system irradiating for scanning an electron beam emitted from the electron source on a sample via deflection means having at least two different deflection speeds and an objective lens to form a desired pattern on the sample; a stage mounting the sample; a mark for beam correction provided on the stage; an electron detector detecting a backscattered electron, a secondary electron or a transmission electron obtained by irradiation of the electron beam; a function moving the electron beam by high speed scanning with the deflection means to repeat formation of a patterned beam; a function moving the electron beam on the mark for beam correction by low speed scanning with the deflection means in synchronization with one cycle of the repetition; and a function detecting a backscattered electron or a secondary electron emitted from the mark for beam correction and near it by the low speed scanning or a transmission electron transmitted through the mark for beam correction to correct the position or the deflection distance of the electron beam or blanking time from the detected result.

(2) Electron beam writing equipment of the present invention has: an electron optics system irradiating for scanning plural electron beams arrayed at a predetermined pitch on a sample via deflection means having plural deflectors having at least two different deflection speeds and an objective lens to form a desired pattern on the sample; a stage mounting the sample; a mark for beam correction provided on the stage; and an electron detector detecting a backscattered electron, a secondary electron or a transmission electron obtained by irradiation of the electron beam, wherein the deflection means has a first deflector for high speed scanning and a second deflector for low speed scanning, the plural electron beams are moved in parallel by high speed scanning with the first deflector to form a patterned beam, the plural electron beams are moved in parallel on the mark for beam correction by low speed scanning with the second deflector in synchronization with formation of the patterned beam, and a backscattered electron or a secondary electron emitted from the mark for beam correction and near it by the low speed scanning or a transmission electron transmitted through the mark for beam correction is detected to correct the position or the deflection distance of the electron beam or blanking time from the detected result.

(3) An electron beam writing method of the present invention has the steps of: irradiating an electron beam emitted from an electron source on a sample via an electron optics system having deflection means having at least two different deflection speeds and an objective lens to form a desired pattern on the sample; high speed scanning the electron beam using the deflection means to repeat formation of a patterned beam; low speed scanning the electron beam on a mark for beam correction provided on a stage mounting the sample with the deflection means in synchronization with one cycle of the repetition; detecting a backscattered electron or a secondary electron emitted from the mark for beam correction and near it by the low speed scanning or a transmission electron transmitted through the mark for beam correction; and correcting the position or the deflection distance of the electron beam or blanking time from the detected result.

DETAILED DESCRIPTION OF THE PREFERRED EMBODIMENTS

Embodiments of the present invention will be described below with reference to the drawings.

Embodiment 1

Figure 1:
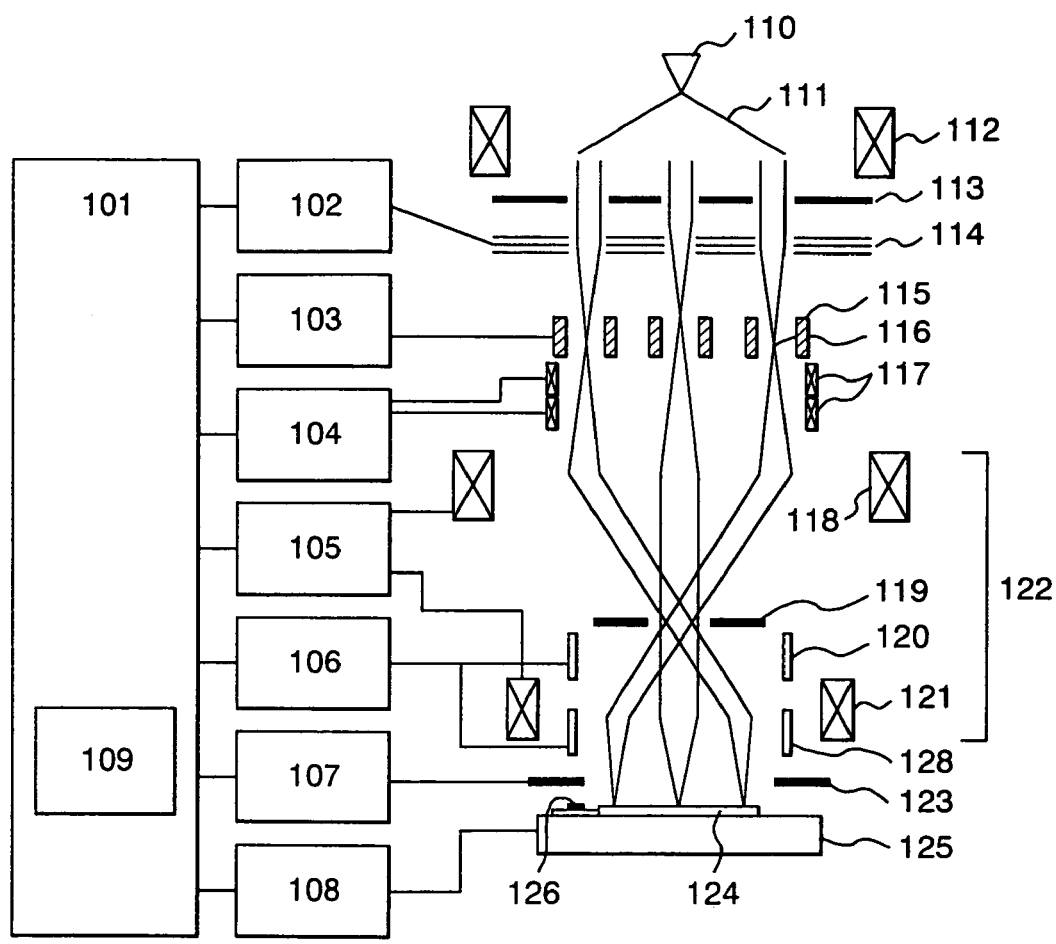
FIG. 1 is a diagram showing an equipment configuration according to Embodiment 1 of the present invention.

FIG. 1 shows the configuration of electron beam writing equipment used in this embodiment.

An electron beam 111 emitted from an electron gun (electron source) 110 is a parallel beam through a condenser lens 112, and is then divided into plural point beams by an aperture array 113 having plural apertures. A lens array 114 at the later stage forms intermediate images 116 of the point beams. A blanker array 115 and a blanking aperture 119 are provided so as to individually switch on/off the plural point beams.

The multi point beams thus formed are condensed by a doublet lens 122 having a first projection lens 118 and a second projection lens 121 to be image formed onto a sample 124. The multi beams are distant from each other so as to provide large field projection in which the maximum distance of an electron beam on a pupil image is substantially longer than the maximum distance of the electron beam on an object plane.

Between the object plane and the image plane of the doublet lens 122, there are a deflector 120 for high speed and a deflector 128 for low speed to define the writing position on the sample 124. On a stage 125 is provided a mark 126 for detecting the position of an electron beam. A laser interferometer, not shown, measuring the position of the stage 125 and a backscattered electron detector 123 are used to measure the position of an electron beam. In this example, the electron detector detecting a backscattered electron or a secondary electron from the mark 126 is used for measuring the position of an electron beam. An electron detector detecting an electron transmitted through an aperture mark may be also used.

Above the first projection lens 118 as the first lens of the doublet lens 122 are provided aligners 117 in two stages. They are engaged with each other to adjust the incident angle and the incident position of an electron beam upon the lens. The aligners 117 are driven by an aligner control circuit 104. The doublet lens 122 is driven by a lens control circuit 105. In this embodiment, specifically, electric currents are supplied. The set value of each of the electric currents is decided by information given by a data control circuit 101. Similarly, a focus control circuit 102 and a pattern generating circuit 103 supply a voltage to operate the corresponding optical device. The set values of these are also decided by information given by the data control circuit 101. The data control circuit 101 uses information obtained from a signal handling circuit 107 and a stage control circuit 108 to perform calculation deciding the amounts of operation of the lenses and the aligners. This equipment has a display 109 having a screen making use of these functions to set the change of excitation, display the amount of change of the position of an electron beam, or reset the aligners and lens excitation currents.

Figure 2:
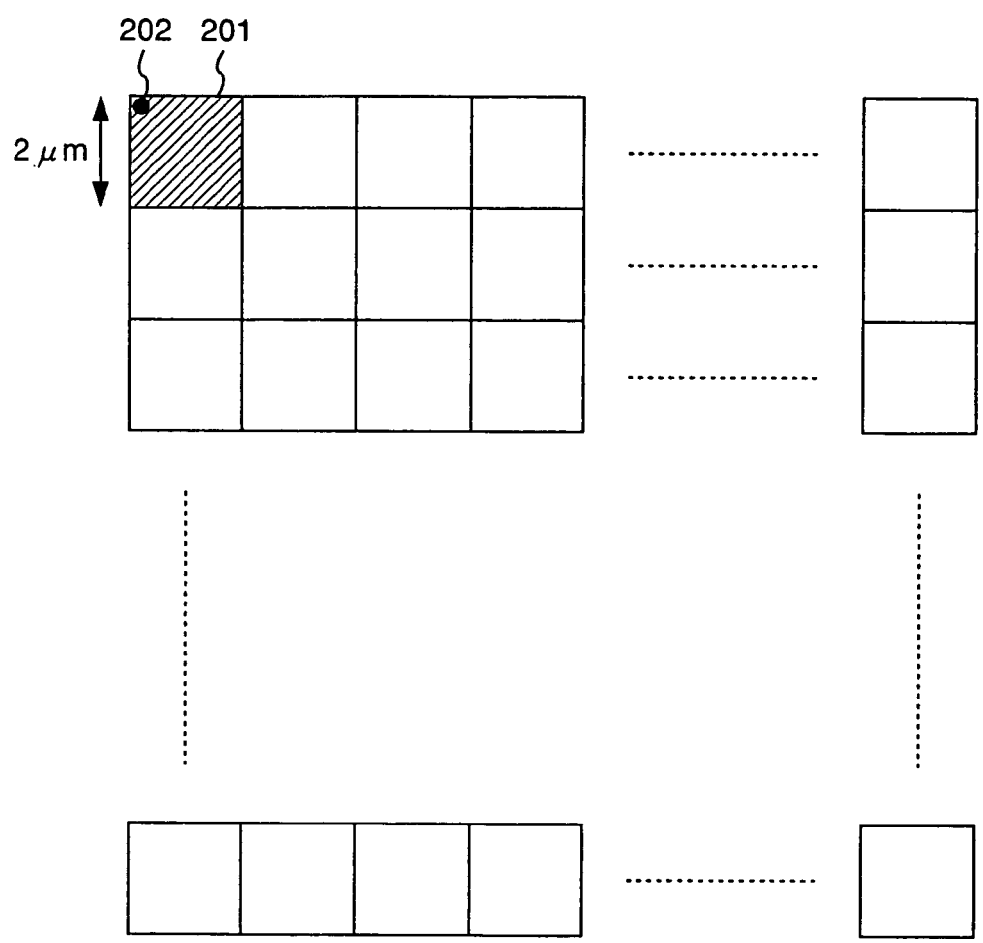
FIG. 2 is a diagram of assistance in explaining a deflection corrected micro field.

As shown in FIG. 2, the pitch of multi beams 202 of this embodiment on the sample is 2 μm. Each of the beams must write a micro field 201 of 2 μm square. In this writing method, on/off of an electron beam is controlled during 2 μm square writing to form a pattern. To increase the throughput, the micro field must be deflection scanned at high speed. A special deflector scans it. To correct the 2 μm square deflection, the following means is used.

Figure 3:
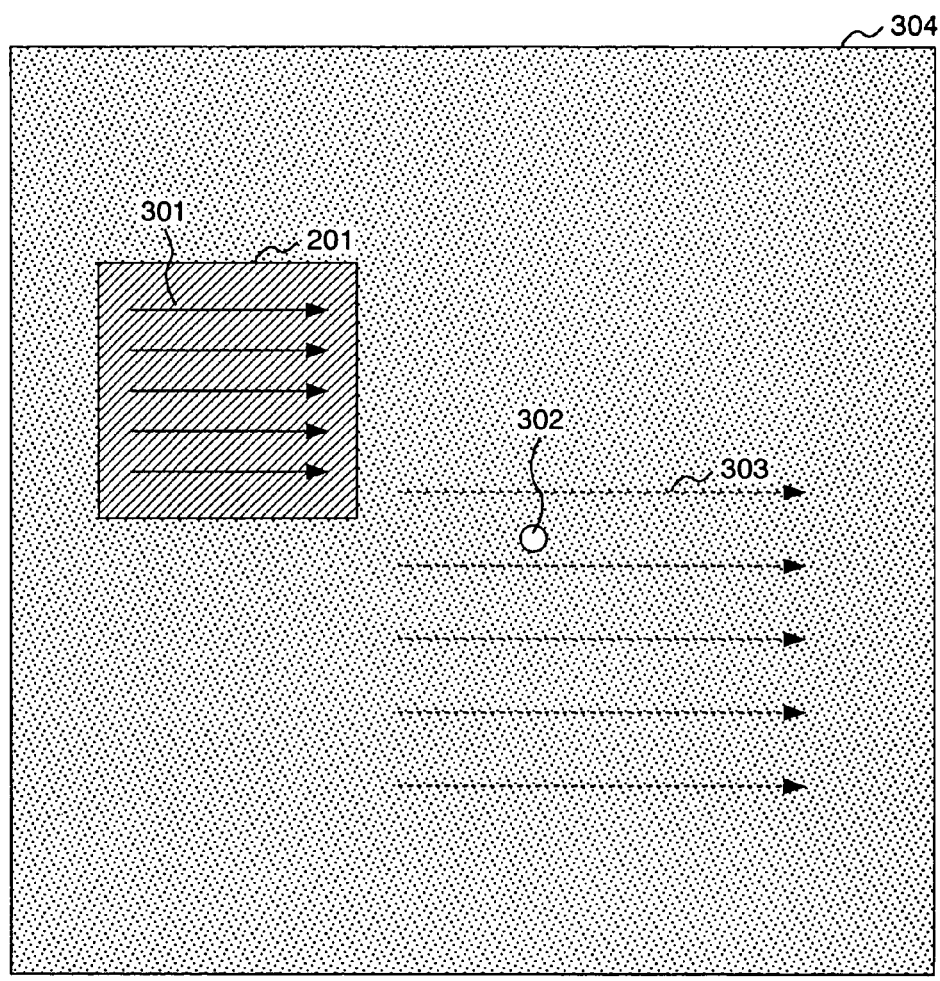
FIG. 3 is a diagram of assistance in explaining a scanning method according to Embodiment 1 of the present invention.

FIG. 3 shows its scanning method. High speed scanning 301 is performed on the entire surface of the micro field 201. The two-dimensional scanning process is repeated. Low speed scanning 303 is performed on a mark for beam correction 302 of 0.1 μm circle formed on a silicon substrate 304 provided on the stage 125 in engagement with (in synchronization with) one process (one cycle) of the scanning process. Summation of one cycle of high speed scanning is considered, which is equal to the electron beam of 2 μm square.

The present invention is based on new findings in consideration of substantially converting a deflection field to a beam shape.

As described above, in synchronization with one cycle of the repetition process of the high speed scanning 301 on the entire surface of the micro field 201, two-dimensional scanning is performed on the mark for beam correction 302 by the low speed scanning 303. A rectangular beam image of 2 μm square can be obtained. The size of the image is measured to perform deflection correction of the micro field.

Figure 4:
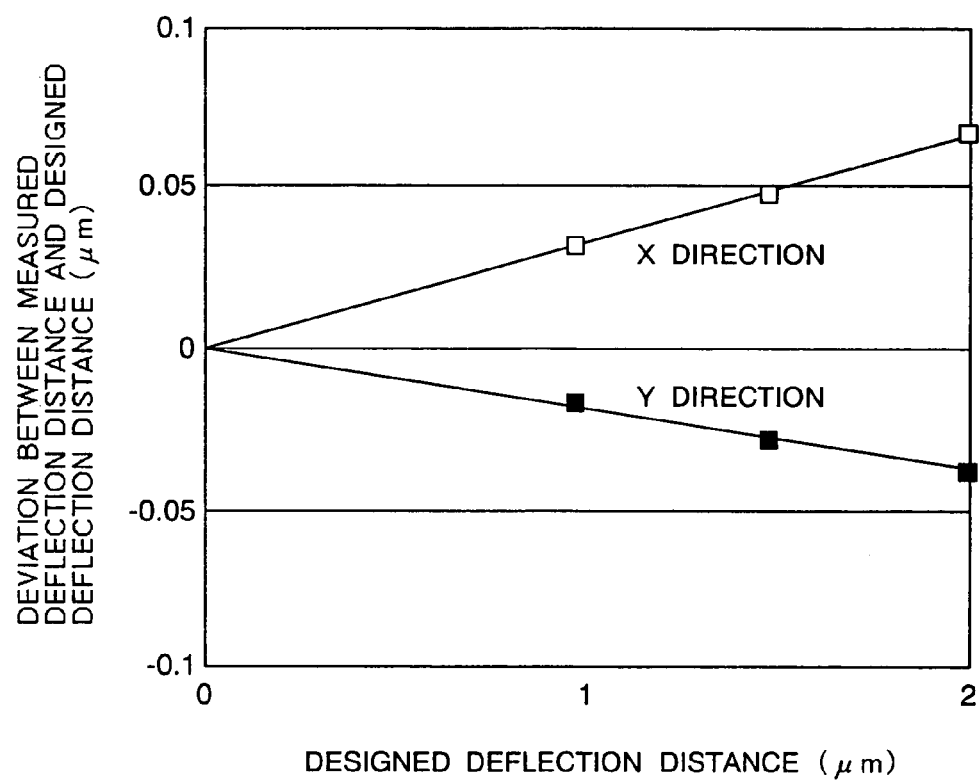
FIG. 4 is a diagram showing measured results of linearity according to Embodiment 1 of the present invention.

Using the multi beam writing function, the on/off control of an electron beam during scanning can form an electron beam image of a substantially arbitrary shape. Linearity of deflection can be also measured. FIG. 4 shows measured results of linearity. In the drawing, the horizontal axis indicates a desired design deflection distance (μm) and the vertical axis indicates a difference between an actually measured deflection distance and the design deflection distance. Deflection in the X direction obtains a large gain, and deflection in the Y direction obtains a small gain. The result is fed back to finally reduce an error of the linearity below 5 nm.

Image shape measurement corresponds, not only to a rectangular pattern, but also to an arbitrary pattern. The means can inspect writing data and measure the limit of a blanking speed.

Embodiment 2

Figure 5:
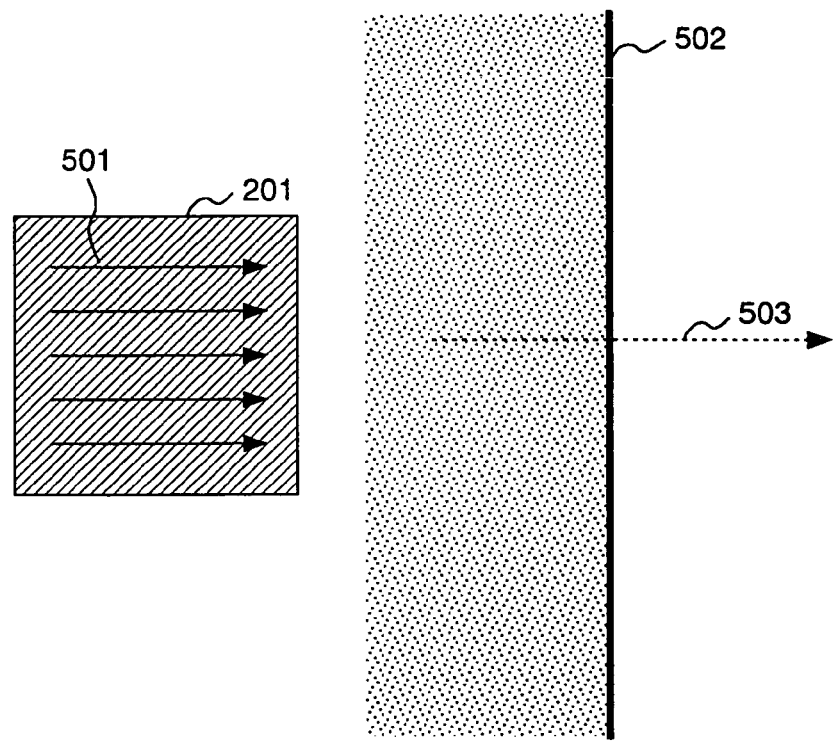
FIG. 5 is a diagram of assistance in explaining a scanning method according to Embodiment 2 of the present invention.

The same equipment as that of Embodiment 1 is used. A knife edge 502 as shown in FIG. 5 is used as a mark for detection. Gallium arsenide is used as the material of the knife edge 502. A Faraday cup is used to detect and differentiate a detected signal of a transmission electron, thereby obtaining a beam profile. Low speed scanning in this case is substantially one-dimensional scanning. High speed scanning 501 is performed on the entire surface of the micro field 201. The two-dimensional scanning process is repeated. Low speed scanning 503 is performed on the knife edge 502 in engagement with (in synchronization with) one process (one cycle) of the scanning process.

Figure 6:
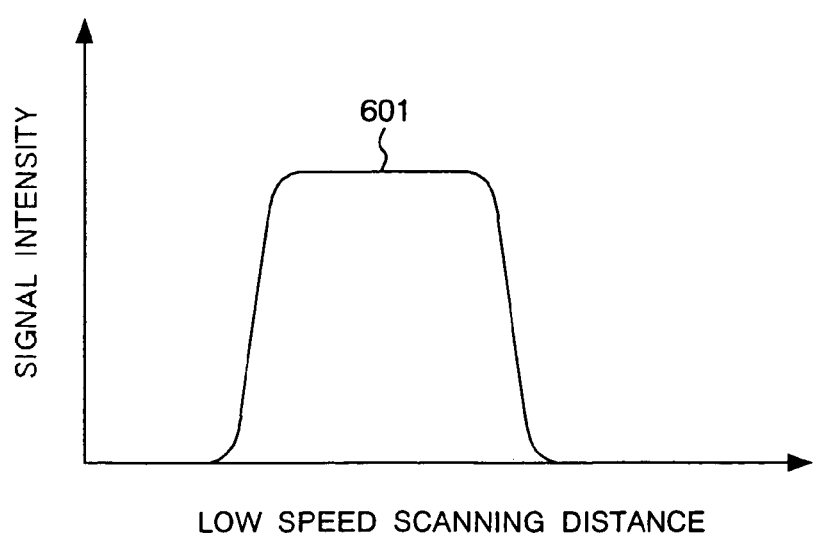
FIG. 6 is a diagram showing an example of a beam profile obtained by scanning of FIG. 5.

FIG. 6 shows a beam profile obtained by the scanning method shown in FIG. 5. In the drawing, the horizontal axis indicates a low speed scanning distance and the vertical axis indicates the signal intensity of a detected transmission electron. The resolution of the knife edge 502 is sufficiently high. The tilt of the edge is caused mainly by unfocusing of the beam. This is used to adjust a stigma and a focal point.

In the present invention, unfocusing of the beam can be measured in the state close to actual writing. This can obtain ±0.2 µm as reproducibility of focal point correction.

Figure 7A:
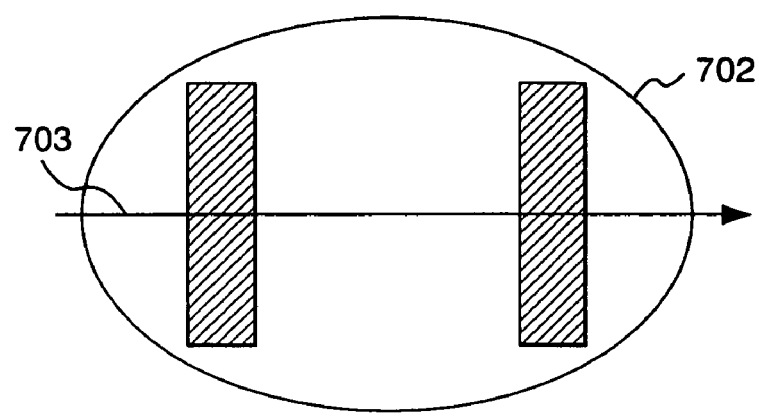
FIGS. 7a to 7b are diagrams showing another example of the beam profile.
Figure 7B:
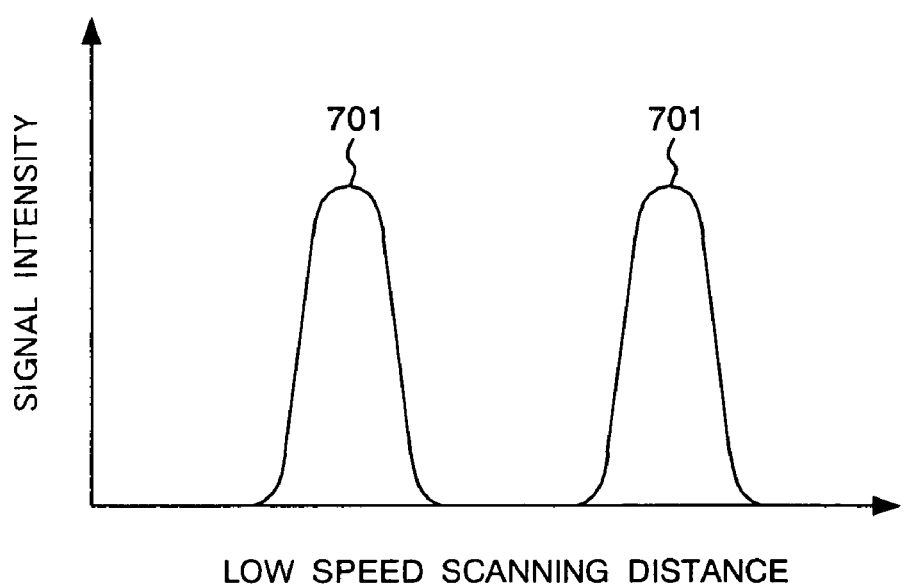

An example in which the shape of a beam image is devised is shown. FIG. 7*a* is an example in which the pattern of a micro field having a shape 702 so as to switch on/off a beam in separately provided two areas is used for measurement in a scanning direction 703 as shown in FIG. 7*b*. As a result, a beam profile 701 is divided into two crests. The distance of its peak is measured to correct high speed deflection. Measuring the center of the crest can increase the precision more easily than measuring the width of the crest. This is a correction method making use of the characteristic of this writing method.

In this case, in scanning in the 90° right angle direction, the on position may be changed during high speed operation.

Embodiment 3

Figure 8:
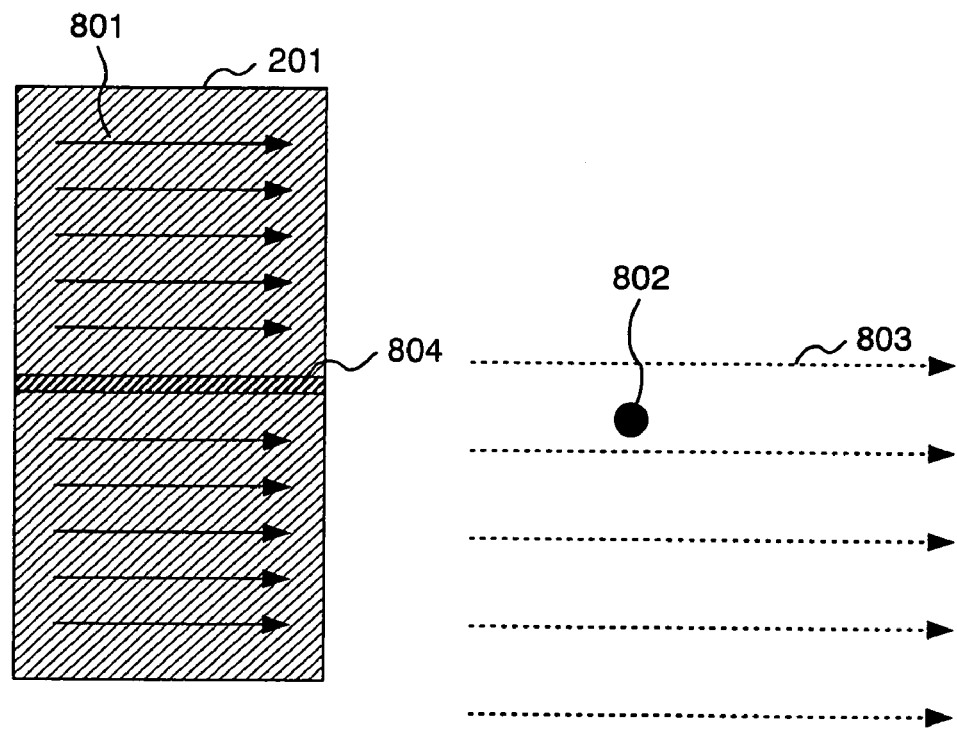
FIG. 8 is a diagram of assistance in explaining a scanning method according to Embodiment 3 of the present invention.

In this embodiment, plural multi beams are used. In FIG. 8, high speed scanning 801 is performed on the entire surface of the micro field 201 by moving adjacent multi beams in parallel. As seen in the drawing, this can form a rectangular beam of about 2 µm×4 µm by high speed scanning of one cycle. In this case, when there is an error in the construction of the micro field or there is an error in the pitch of the multi beams, connection of the boundary parts is not complete. In FIG. 8, the distance between the two multi beams is short and the micro fields are overlapped at the boundary parts to make an overlap area 804. As a result, the intensity uniformity of the synthesized beam is deteriorated.

This embodiment uses a backscattered electron signal produced by forming a tungsten dot 802 of 0.15 µm on the silicon thin film substrate 304 to be low speed scanned thereon. A signal intensity distribution thus obtained is resolved to write the boundary part of the micro field with high precision. The origin point position of each of the multi beams is corrected by adjusting lens excitation and the intensity of a rotating coil. An error of connection of the boundary areas can be below 5 nm.

Measurement using plural beams is important. The results of individually measured plural beams are compared to enable adjustment and monitoring of uniformity in multi beam writing.

As described in the above embodiments in detail, the present invention can correct a micro field of electron beam writing equipment with high precision. In addition, deflection scanning as the concept of the present invention is used for conversion to a beam shape. Various elements such as a focal point, a stigma and an origin point position can be adjusted.

The present invention can realize electron beam wiring equipment and writing method which can correct deflection for a micro field of the electron beam writing equipment with high precision.

What is claimed:

1. Electron beam writing equipment, comprising:
   an electron beam source for emitting an electron beam
   a sample stage provided with a detection mark;
   first deflection means for deflecting the emitted electron beam within a deflection field at a first speed;
   second deflection means for deflecting the emitted electron beam in an area including the detection mark at a second speed slower than the first speed;
   a detector for detecting a secondary electron, a backscattered electron or a transmission electron generated by irradiating the electron beam to the detection mark;
   a control means for correcting a position or a deflection distance of the electron beam from the detected result of said detector; and
   means for moving the deflection field in an area including the detection mark,
   wherein a repetition of a scan by said second deflection means is synchronized with a cycle of a scan by said first deflection means.

2. Electron beam writing equipment, comprising:
   an electron beam source for emitting an electron beam;
   a sample stage for mounting the sample;
   a substrate including a detection mark;
   means for scanning the electron beam to a first area on said substrate and a second area including the detection mark on the substrate;
   first deflection means for deflecting the emitted electron beam within a first area at a first speed;
   second deflection means for deflecting the emitted electron beam in a second area at a second speed slower than the first speed;
   a detector for detecting a secondary electron, a backscattered electron or a transmission electron generated by irradiating the electron beam to the second area; and
   a control means for correcting a position or a deflection distance of the electron beam from the detected result of said detector,
   wherein a repetition of a scan by said second deflection means is synchronized with a cycle of a scan by said first deflection means.

3. The electron beam writing equipment according to claim 2, wherein said substrate is arranged on said sample stage independently to the sample, and the first area is scanned except the detection mark on said substrate.

4. The electron beam writing equipment according to claim 1, further comprising:
   multi beam optics unit for irradiating a multi beam to the sample.

5. The electron beam writing equipment according to claim 1, further comprising;
   a blanker array and a blanking aperture that are provided so as to individually switch on/off said electron beam optics unit.

6. The electron beam writing equipment according to claim 1, wherein said detection mark contains an aperture mark or a knife edge.

7. The electron beam writing equipment according to claim 1, further comprising:
   a signal handling circuit, which handles the signal intensity of the secondary electron, the backscattered electron or the transmission electron detected with said detector by scanning the electron beam to the second area; and
   means for correcting the position or the deflection distance of the electron beam from the result of said signal handling circuit.

8. The electron beam writing equipment according to claim 1, further comprising;
   a control circuit which corrects the position, the deflection distance of the electron beam or a blanking time.

9. The electron beam writing equipment according to claim 1, wherein said control means is provided for correcting the position or the deflection distance in the deflection field of the electron beam from the detected result of said detector.

10. The electron beam writing equipment according to claim 2, further comprising:
    multi beam optics unit for irradiating a multi beam to the sample.

11. The electron beam writing equipment according to claim 2, further comprising:
    a blanker array and a blanking aperture that are provided so as to individually switch on/off said electron beam optics unit.

12. The electron beam writing equipment according to claim 2, wherein said detection mark contains an aperture mark or a knife edge.

13. The electron beam writing equipment according to claim 2, further comprising:
    a signal handling circuit, which handles the signal intensity of the secondary electron, the backscattered electron or the transmission electron detected with said detector by scanning the electron beam to the second area; and
    means for correcting the position or the deflection distance of the electron beam from the result of said signal handling circuit.

14. The electron beam writing equipment according to claim 2, further comprising;
    a control circuit which corrects the position, the deflection distance of the electron beam or a blanking time.

15. The electron beam writing equipment according to claim 2, wherein said control means is provided for correcting the position or the deflection distance in the deflection field of the electron beam from the detected result of said detector.

* * * * *